United States Patent [19]
Kobayashi et al.

[11] Patent Number: 5,340,460
[45] Date of Patent: Aug. 23, 1994

[54] VACUUM PROCESSING EQUIPMENT

[75] Inventors: Masahiko Kobayashi; Hirobumi Takemura; Tetsuo Ishida; Nobuyuki Takahashi, all of Fuchu, Japan

[73] Assignees: Anelva Corporation, Tokyo, Japan;

[21] Appl. No.: 746,920

[22] Filed: Aug. 19, 1991

[30] Foreign Application Priority Data

Aug. 22, 1990 [JP] Japan .................. 2-220416
Jun. 28, 1991 [JP] Japan .................. 3-157278

[51] Int. Cl.$^5$ ........................................ C23C 14/34
[52] U.S. Cl. ........................ 204/298.09; 204/298.03; 204/298.32; 156/345
[58] Field of Search ........... 204/192.1, 192.12, 192.15, 204/298.02, 298.03, 298.07, 298.31, 298.09, 298.32; 118/724; 156/345

[56] References Cited

U.S. PATENT DOCUMENTS

| | | | |
|---|---|---|---|
| 3,840,451 | 10/1974 | Golyanov et al. | 204/298.09 X |
| 4,428,811 | 1/1984 | Sproul et al. | 204/192.15 X |
| 4,475,045 | 10/1984 | Holden et al. | 250/492.2 |
| 4,846,948 | 7/1989 | Saito et al. | 204/192.15 X |
| 4,849,081 | 7/1989 | Ross | 204/292.15 |
| 4,956,043 | 9/1990 | Kanetomo et al. | 204/298.09 X |
| 4,966,669 | 10/1990 | Sadamori et al. | 204/298.09 X |

FOREIGN PATENT DOCUMENTS

| | | | |
|---|---|---|---|
| 58-210161 | 12/1983 | Japan . | |
| 0235469 | 10/1987 | Japan | 204/298.09 |
| 1075031 | 3/1989 | Japan | 204/298.09 |

*Primary Examiner*—Nam Nguyen
*Attorney, Agent, or Firm*—Edward D. Manzo; Mark J. Murphy; Ted K. Ringsred

[57] ABSTRACT

A vacuum processing equipment is disclosed, which comprises a vacuum chamber and main and fore vacuum pumping mechanism for pumping down the vacuum chamber. The fore vacuum pumping mechanism includes a cooling means and a residual gas trapping means coupled to the cooling means. The cooling means is provided outside the vacuum chamber. The residual gas trapping means is provided in a zone of the vacuum chamber free from interference with the vacuum processing.

14 Claims, 10 Drawing Sheets

FIG_1
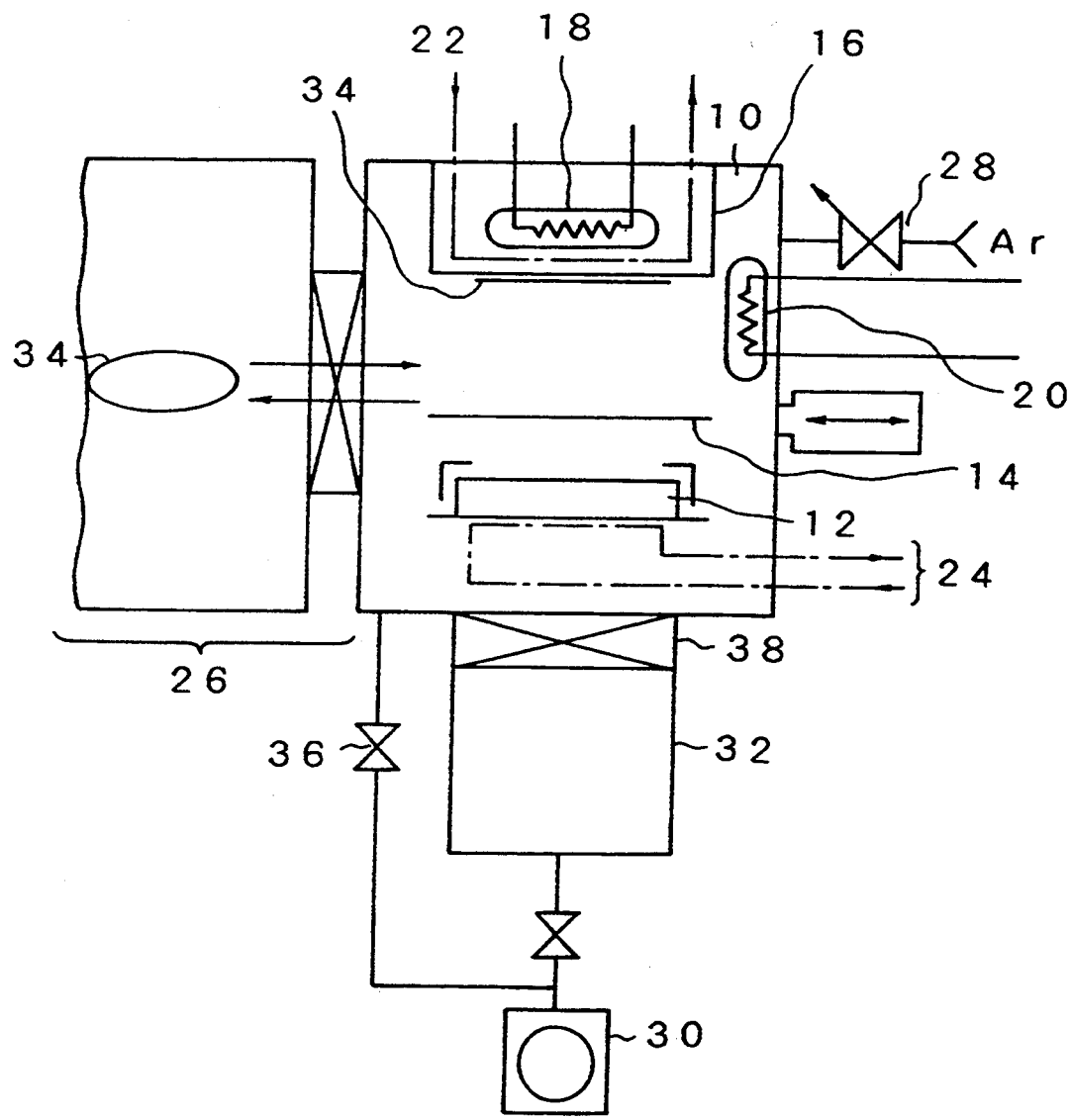
PRIOR ART

FIG_2
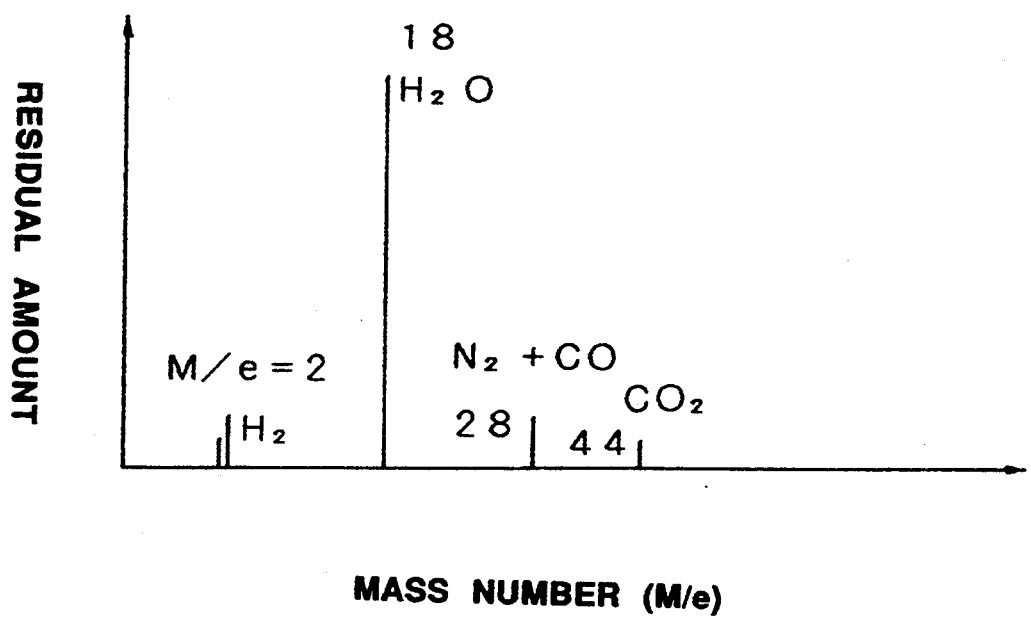
PRIOR ART

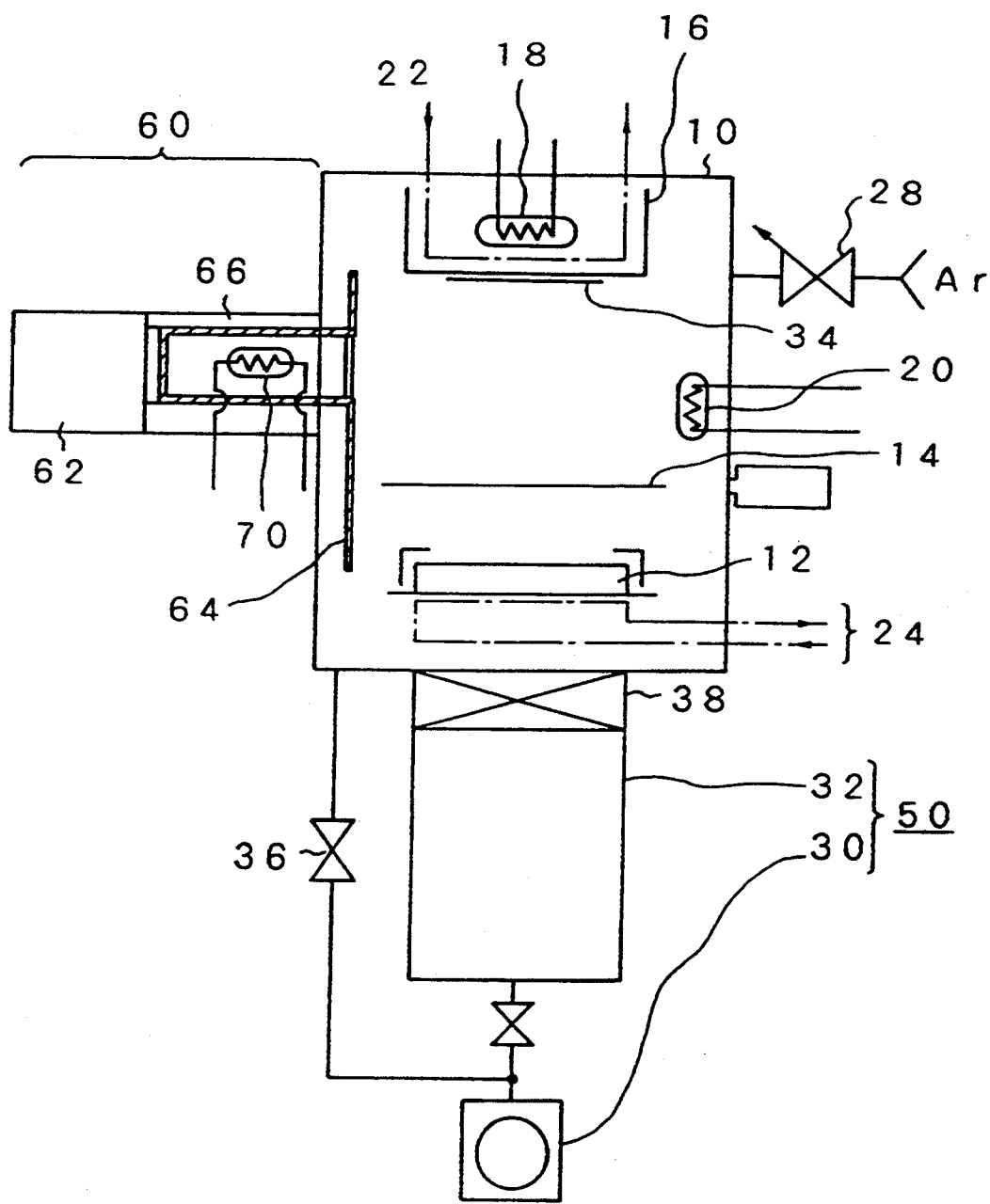
FIG_3

FIG_4
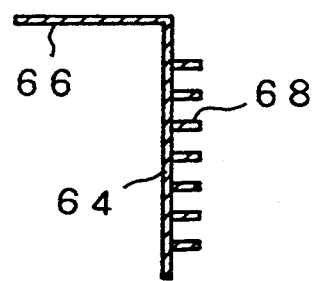
FIG_5
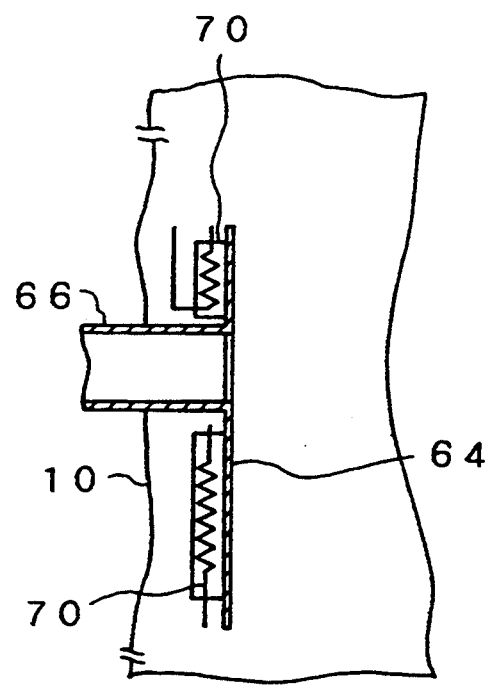

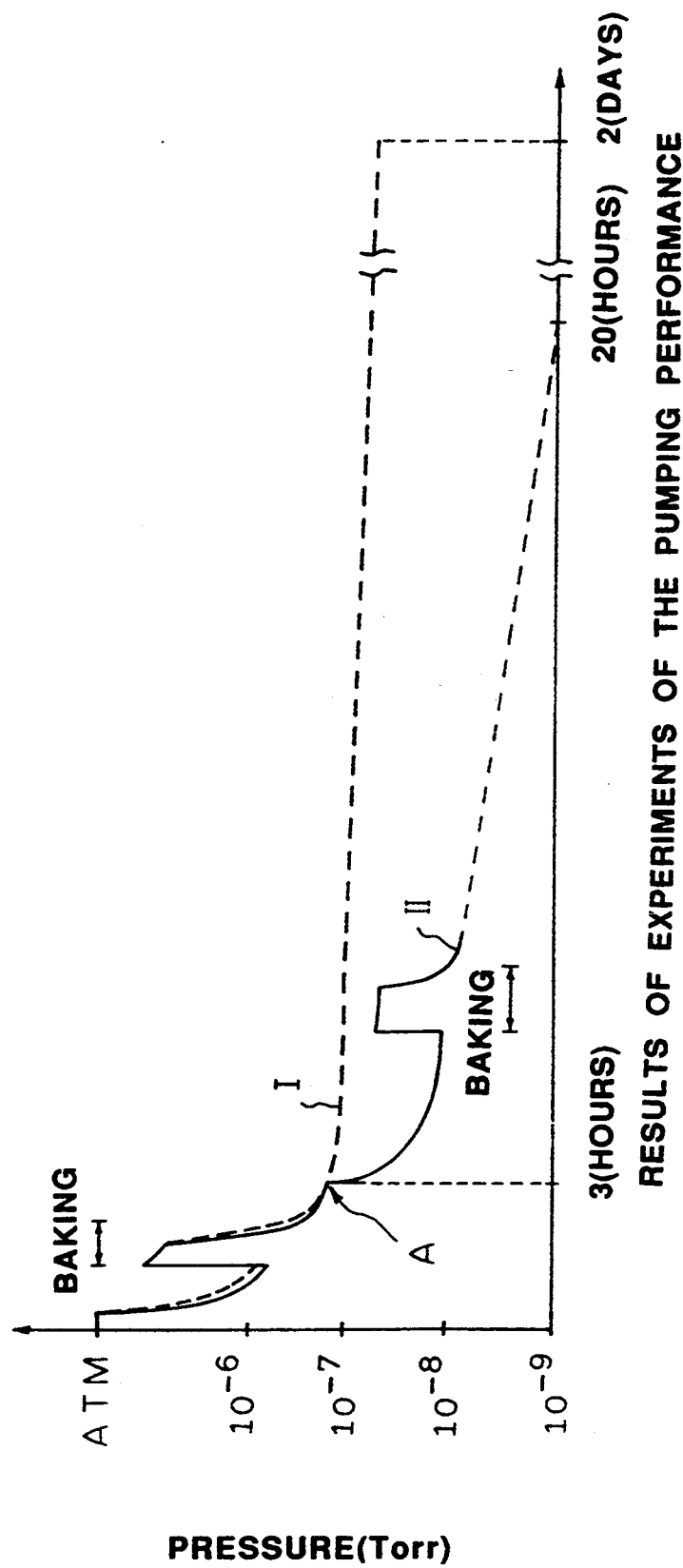

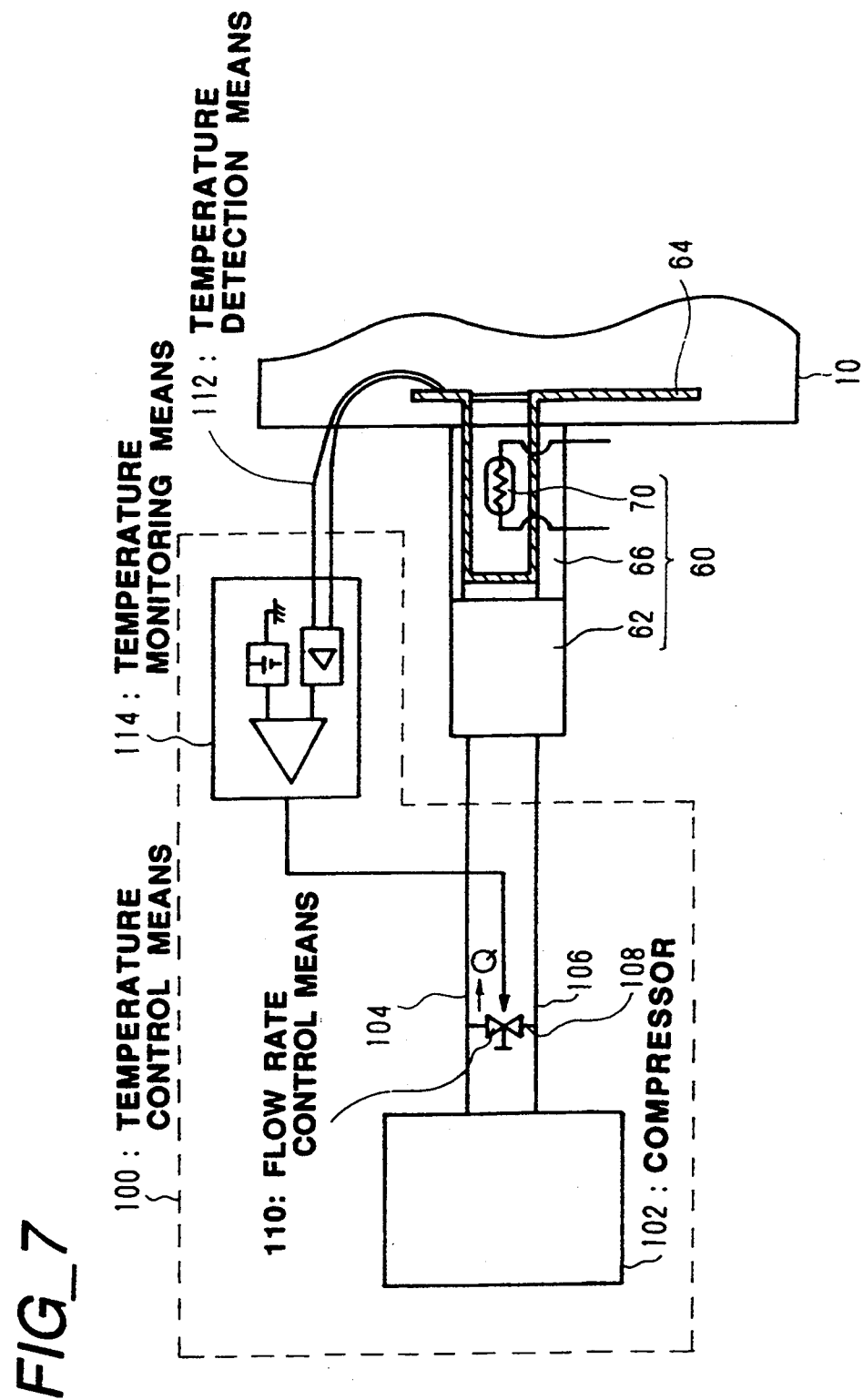
FIG_7

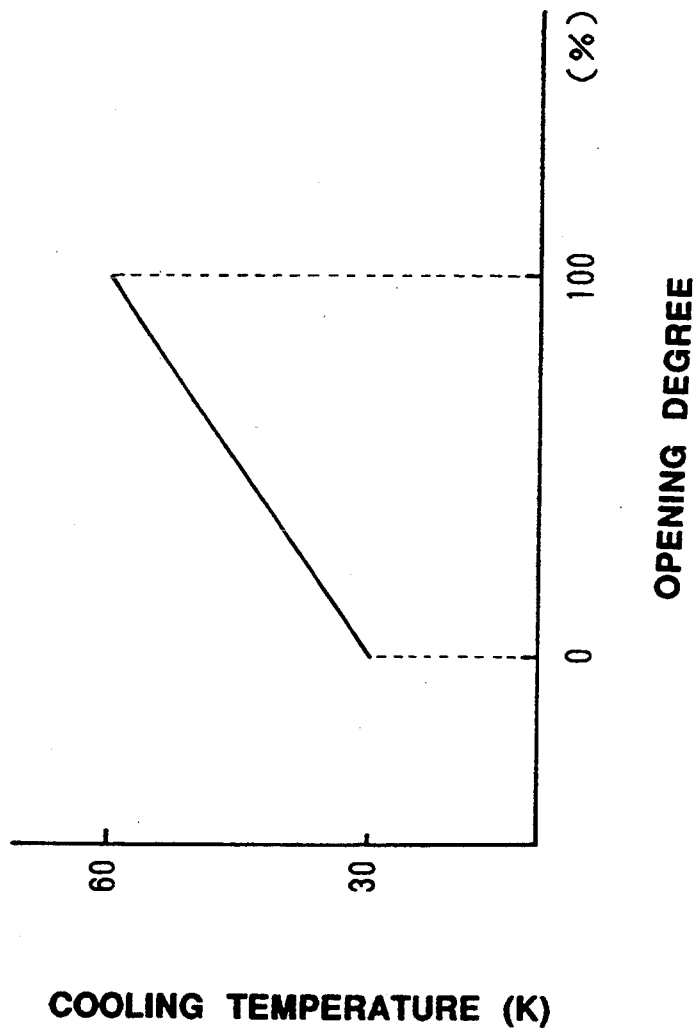

FIG_9(A)
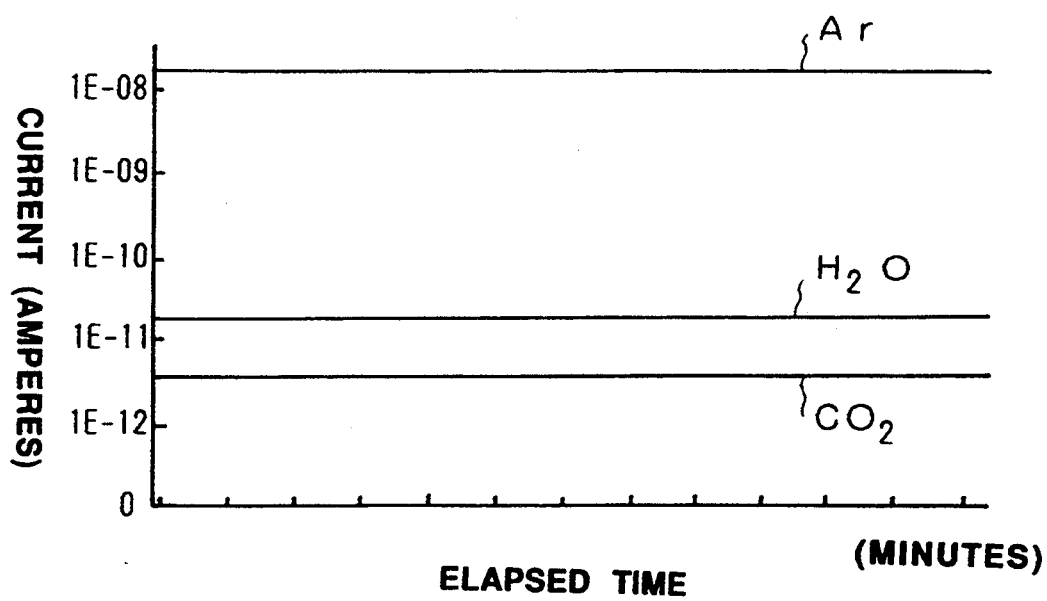
FIG_9(B)
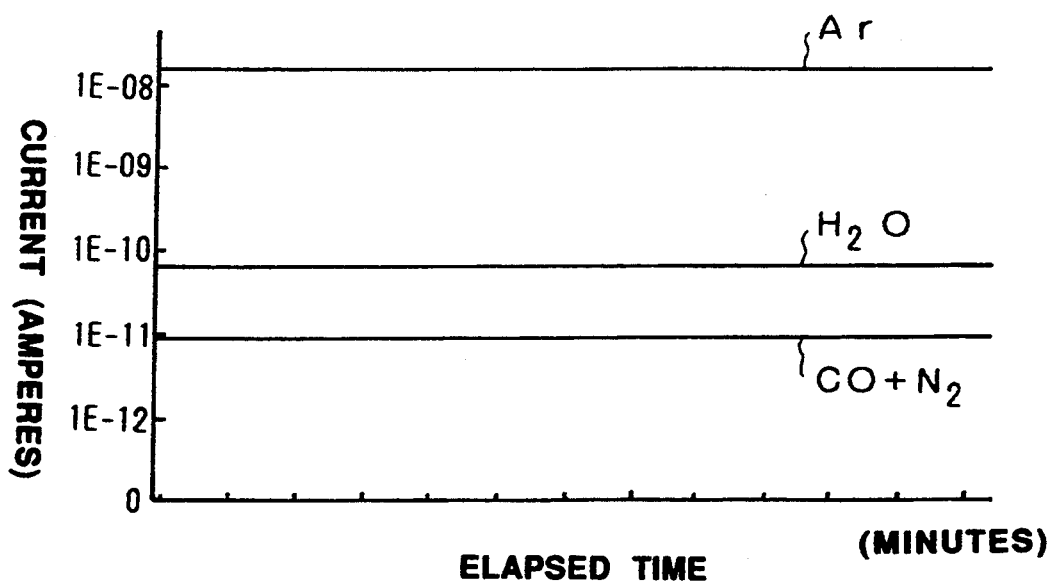

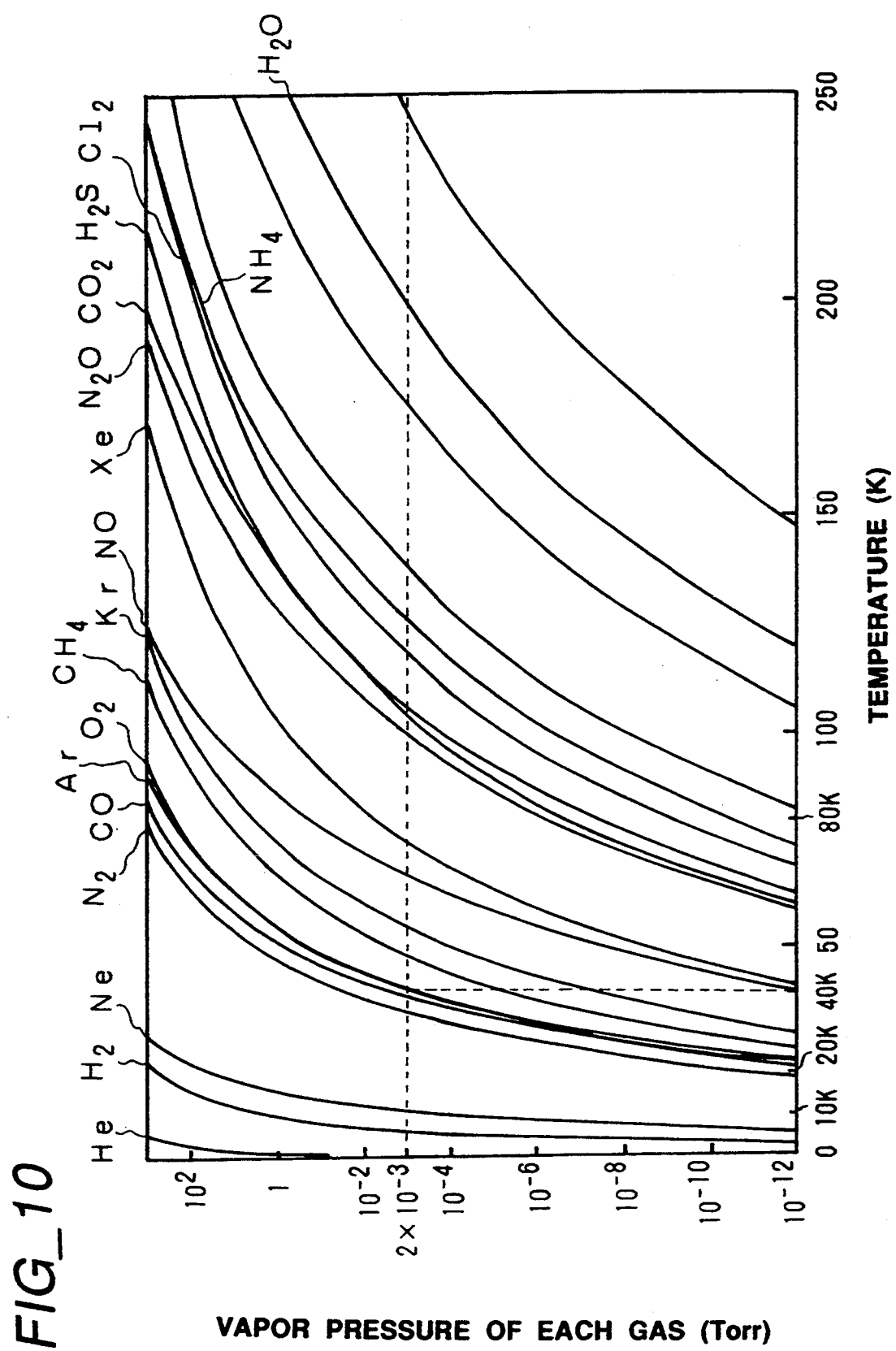
FIG_10

FIG_11(A)
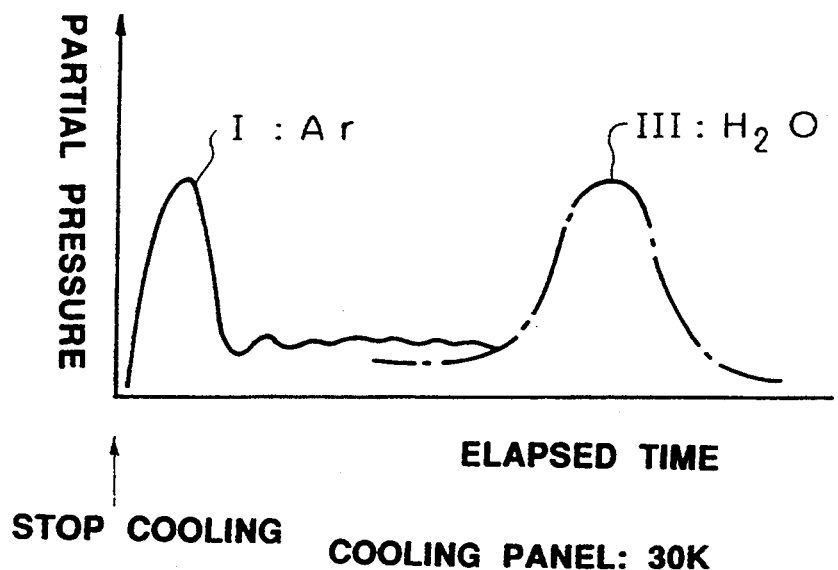
FIG_11(B)
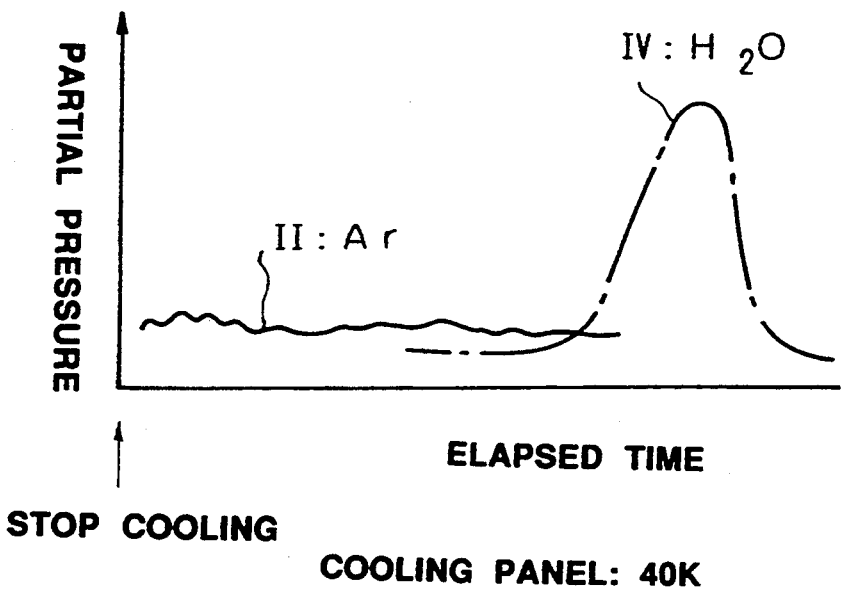

VACUUM PROCESSING EQUIPMENT

BACKGROUND OF THE INVENTION

1. Field of the Invention

The present invention relates to a Vacuum Processing Equipment and a vacuum processing method for improved vacuum pumping performance.

2. Detailed Description of Related Art

A structure of a prior art vacuum processing equipment is illustrated schematically by referring to the typical sputtering equipment shown in FIG. 1. The equipment has a vacuum chamber (or sputtering chamber) 10, in which is provided a cathode 12 capable of including a target, a shutter 14 capable of being opened and closed, a holder 16 for holding a wafer, heaters 18 and 20 for baking and cooling down 22 and 24. The chamber 10 is also provided with a wafer conveying system 26 for in-line processing and a gas supplying system 28. The chamber 10 is further provided with a main pumping mechanism for vacuum pumping it. The main pumping mechanism is a complicated mechanism including a rough vacuum pump 30 and a main pump 32, for example, a cryogenic and the like.

Reference number 34 is a wafer. The chamber 10 is usually kept in a vacuum. In this state the wafer can be put on the holder 16 in the chamber 10 and also taken out of the same by the wafer conveying system 26. Reference number 36 is a rough pumping valve 36. At reference number 38 is a main valve. The above various constituent elements may have well-known specific structures, thus the matter of detail are not described.

The chamber 10 is pumped down with the main vacuum pumping mechanism of the sputtering equipment as follows.

First of all, the chamber 10 is preliminarily evacuated with the rough vacuum pump 30. After completing the rough evacuation, the rough vacuum pump 30 is switched over to the main pump 32 to pump down the chamber 10 to as high a vacuum as about $10^{-7}$ Torr. Usually during evacuating, the chamber 10 is baked by operating the heaters 20 and 18 in suitable timings.

However, as described above, the chamber 10 accommodates various constitute elements, and therefore its actual inner surface area is very large. Besides, since it extensively uses elastomer gaskets (mainly Byton O-ring), sufficient baking can not be obtained. Therefore the attainable ultimate vacuum is as low as about $10^{-7}$ Torr. A high vacuum in the order of $10^{-8}$ is obtainable by performing long time baking and target cleaning. Heretofore, however, a couple of days were necessary to reach $7 \times 10^{-8}$ Torr. This fact is applicable not only to the sputtering apparatus but also the other apparatuses such as dry etching apparatus as well.

It is well known in the prior art that the vacuum degree is still low, and it takes long time to reach the desired pressure. Thus, there arises a problem in that it is impossible to improve the throughput.

The inventors of this application, accordingly, have conducted research and investigations for a purpose of improving the pumping performance ( i.e., attainable ultimate vacuum degree and pumping time).

They have reached the conclusion that the evacuation of residual atmospheric main gases in the chamber, excluding the introduced gas under the ultimate pressure, are $H_2$, $H_2O$, $N_2 + CO$, $CO_2$, etc., as shown in FIG. 3. The predominant gases among them is $H_2O$ (water component). Therefore, in the equipment of the prior art, water ($H_2O$) is present as a main component of the residual gas due to the equipment having complicated construction and a lack of baking. This water component determines a limit on the pumping performance such as attainable ultimate pressure and pumping time. As a result, the pumping performance can be improved by trapping at least the water component among the residual gas components.

SUMMARY OF THE INVENTION

A first object of the present invention, accordingly, is to provide a vacuum processing equipment having improved pumping performance.

A second object of the present invention is to provide a vacuum processing method having improved performance.

To attain the first object of the invention, there is provided a first embodiment comprising a chamber and main and fore vacuum pumping mechanisms for pump down of the vacuum chamber. The fore vacuum pumping mechanism includes nothing less than cooling means and residual gas trapping means coupled to the cooling means.

The cooling means is provided outside the vacuum chamber.

The residual gas trapping means is provided in a zone of the vacuum chamber free from interference with the vacuum processing.

According to the embodiment of the present invention, in addition to the main vacuum pumping mechanism, which may include a rough vacuum pump and a main pump, the fore vacuum pumping mechanism includes the cooling means and residual gas trapping means. That is, a fore pump is provided, and the trapping means to be cooled down is disposed in the vacuum chamber.

Thus, the pumping speed may be increased by making the exposed surface area of the trapping means as large as possible. By cooling the trapping means with the cooling means, water molecules incident on the trapping means among the unnecessary residual gas components may be trapped efficiently to increase the attainable vacuum degree.

Moreover, where the cooling temperature of the trapping means can be controlled, it is possible to let water molecules alone be trapped while inhibiting the exhausting of the sputtering gas, for example argon (Ar) gas, introduced into the evacuation chamber. It is thus possible to increase the pumping performance without adversely affecting the process gas pressure control.

To attain the first object of the present invention, there is also provided as a second embodiment of the invention an pumping apparatus comprising a vacuum chamber and main and fore vacuum pumping mechanisms for evacuating the vacuum chamber, in which the fore vacuum pumping mechanism includes:

(a) trapping apparatus disposed in the vacuum chamber for trapping residual gas;

(b) cooling apparatus disposed outside the vacuum chamber and coupled to the trapping apparatus for cooling the trapping apparatus; and (c) temperature control apparatus for controlling the cooling temperature of the trapping apparatus.

With this construction, the cooling temperature of the trapping means can be finely controlled by the temperature control means to a temperature suitable for effectively trapping residual gas. Thus, in addition to the operation and effects of the first embodiment, the pumping efficiency can be increased more efficiently.

To attain the second object of the present invention, there is provided as a third embodiment of the invention which is a pumping method using a vacuum apparatus comprising a vacuum chamber and main and fore vacuum pumping mechanisms for evacuating the vacuum chamber, the fore vacuum pumping mechanism including trapping means disposed in the vacuum chamber for trapping residual gas, cooling means disposed outside the vacuum chamber and coupled to the trapping for cooling down the trapping means and temperature control means for controlling the temperature of the trapping means. The method comprises the steps of:

performing rough pumping with the main vacuum mechanism;

performing further vacuum pumping to a high vacuum degree with the fore vacuum pumping mechanism;

introducing a vacuum processing gas into the vacuum chamber after reaching a predetermined pressure;

setting the pressure of the vacuum processing gas; and setting the temperature of the trapping means to the temperature of saturated vapor pressure corresponding to the pressure setting of the vacuum processing gas.

With this construction as the third embodiment of the invention, the cooling temperature of the trapping means is set to the temperature of a saturated steam pressure corresponding to the pressure setting of the vacuum processing gas introduced into the vacuum chamber, and it is thus possible to exhaust the residual gas efficiently.

BRIEF DESCRIPTION OF THE DRAWINGS

FIG. 1 is a schematic view showing prior art sputtering equipment of a prior art;

FIG. 2 is a residual gas component diagram for explaining the attainable ultimate pressure with the prior art sputtering equipment;

FIG. 3 is a schematic view showing sputtering equipment of an example of the vacuum processing equipment according to the present invention;

FIG. 4 is a view illustrating a state of mounting for a fore vacuum pump mechanism;

FIG. 5 is a view illustrating a different example of trapping means;

FIG. 6 is a view showing results of experiments comparing the pumping performance according of the present invention and that of prior art sputtering equipment;

FIG. 7 is a view illustrating an example of temperature control means used for the vacuum equipment according to the present invention;

FIG. 8 is a graph showing temperature changes with reference to changes in the flow rate of the cooling medium as a result of experiments;

FIG. 9(A) and 9(B) are graphs showing partial pressure characteristics of impurity gas present in the vacuum chamber when the temperature of a cooling panel as an example of trapping means is set to 40K and normal temperature, respectively;

FIG. 10 is a graph showing saturated vapor pressure curves; and

FIGS. 11(A) and 11(B) are experimental data graphs showing the relation between the impurity partial gas partial pressure in a vacuum chamber and time elapsed after stopping the cooling of a cooling panel as an example of trapping means, to 30K and 40K, respectively.

DETAILED DESCRIPTION OF THE PREFERRED EMBODIMENT

Hereinafter, embodiments of the present invention will be described with reference to the drawings. The following embodiment concerns a sputtering apparatus as an example of the vacuum processing equipment. The drawings illustrate size, shape and positional relationship of various constituent elements only schematically to such an extent that the invention can be understood. In FIG. 3, the same parts as those shown in FIG. 1 are designated by the same reference numerals and symbols, and they are not described in detail excluding particularly mentioned numerals.

Further, in FIG. 3, the wafer conveying system 26 is not shown.

FIG. 3 is a schematic view showing the structure of a sputtering apparatus of an embodiment of the present invention. Like apparatus in the prior art, this embodiment comprises a rough vacuum pump 30 for pumping down a vacuum chamber, i.e., sputtering chamber, 10 and a main vacuum mechanism 50 including a main vacuum pump (i.e., a cryogenic in this embodiment). In the following description, the vacuum chamber may sometimes be referred to merely as the chamber. In the chamber 10, heaters 18 and 20 are provided, if necessary, as heating apparatus for baking so as to help vacuum pumping. A sputtering apparatus as an embodiment of the invention comprises a fore vacuum pumping mechanism 60 in addition to the constituent elements noted above.

The fore vacuum pumping mechanism 60 includes a refrigeration source as cooling means and trapping means (or capturing means) 64. These two elements are coupled to each other via a coupling section 66 of the trapping means.

The refrigeration source 62 may be a heat exchanger having a structure or a tank or the like capable of utilizing liquid nitrogen or liquid helium. As a heat exchanger, those of temperature control type having a low temperature of about 10K for example, are commercially obtainable. The refrigeration source 62 is suitably disposed outside the chamber 10.

The trapping 64 which is coupled to the refrigeration source 62 via the coupling section 66 is disposed in the chamber 10. The trapping means 64 is disposed in a zone such as not to interfere with film formation or with sputtering and so as to provide for increasing the trapping efficiency.

Preferably, therefore, the trapping 64 is provided along the inner wall surface of the chamber 10. However, this is by no means a limitation.

The trapping means 64 is provided for trapping mainly the residual gas components, which are unnecessary for the shape, such as to provide a large surface area in the chamber 10. Thus, the trapping means 64 may be plate-like, disk-like, cylindrical, annular or any other shape, and may be curved or bent. Further, it may be a plate provided with macromatic projections or fins. A structural example of the trapping means 64, comprising a panel provided with fins 68, is shown in FIG. 4.

An example of the fore vacuum pumping mechanism 60 mounted on the chamber 10 is shown in FIG. 7. In this embodiment, the trapping means 64 is a panel which is mounted inside the chamber 10 through one side thereof. The coupling section 66 of trapping means 64 is hermetically sealed and mounted on a side wall of the chamber 10. The coupling section 66 may be rod-like, cylindrical or of any other suitable shape. Preferably, it is as short in length as possible without in curving the problem of robbing ambient heat being transferred and thus preventing temperature rise of the trapping means 64. The trapping means 64 and coupling section 66 thereof are suitably made of a material which is a good heat conductor and capable of withstanding cryogenic temperatures.

The fore vacuum pumping mechanism 60 is provided, if necessary, with cooled trapping means 64, for example, and heating means 70 for quickly heating the panel. If the panel 64 remains cooled down when purging or venting the chamber 10, water ($H_2O$) or like components in atmosphere is absorbed to the surface of the panel 64. In this case, the re-exhausting of the chamber 10 requires long exhausting time. The heating means 70 may use a heater or may have a structure to avoid the above mentioned problem, wherein gas or water at a high temperature can be passed through a gas or water duct line (not shown) to effect sudden heating of the coupling section 66 or trapping means 64 directly or indirectly. In the embodiment shown in FIG. 7, a heater is provided as the heating means 70 in the coupling section 66.

An example of the heating means 70 being provided on the back side of the panel as the trapping means 70 is shown in FIG. 5. In this case, the panel 64 and heating means 70 may be made integral with or closely spaced apart from each other.

An example of the operation of the exhausting system 50 in the sputtering apparatus according to the present invention will now be briefly described.

To operate the exhausting system 50, the rough pumping valve 36 is turned on to evacuate the chamber 10 with the fore vacuum pump 30. When the evacuation is performed to a predetermined pressure, the fore vacuum valve 36 is closed, and the main valve 38 of the main pump 32, which has been made operative in advance, is opened to pump down the chamber 10 to a high vacuum degree. During pumping down, baking is conducted with the heaters 18 and 20. When the baking is completed, the panel 64 is cooled down by the refrigeration source 62 to a temperature effective for trapping the water component on the panel 64.

As a result, water molecules striking the panel surface of the panel 64 are trapped with a cooling effect, and thus water in the chamber 10 is effectively removed, resulting in the attainable ultimate pressure being improved.

However, if the temperature has fallen excessively, the processing gas (or process gas) is also trapped on the panel 64 such that only water molecules can be exhausted.

FIG. 6 shows results of a pumping performance test on the sputtering apparatus of the present invention. In FIG. 6, the ordinate is for the vacuum degree (i.e., pressure), while the abscissa is for the time. With a usual exhausting system having a characteristic as shown by dashed curve I, the vacuum degree reaches $1 \times 10^{-7}$ Torr due to the influence of the water component. It never reaches $10^{-8}$ Torr even after a long time and, for example, takes a couple of days to attain $7 \times 10^{-7}$ Torr.

It is found that according to the present invention, with cooling of the panel 64 as the trapping means 64 at point A as shown by solid curve II, sudden pressure reduction is obtainable without affecting any baking, and it is possible to attain a vacuum degree of $1 \times 10^{-8}$ Torr. As a result, an improvement of by about one figure is obtainable compared to the value in the prior art. It is confirmed that a vacuum degree up to the order of $10^{-9}$ can be attained by affecting the baking. The experimental data shows short time in comparison to the prior art is required to attain a desired vacuum degree. For example, it takes only about 4 or 5 hours to reach $3 \times 10^{-8}$ Torr and even reaching to $10^{-9}$ Torr only takes about 20 hours.

With the trapping means 64, the pumping speed can be increased by expanding its surface area inside the chamber 10 causing a more effective result.

As for the temperature control of the trapping means 64, during the exhausting prior to the introduction of the process gas (Ar), the temperature may be held as low as possible to exhaust various residual gas components, while during sputtering it may be controlled to be 40 to 70K to exhaust mostly water, resulting in being more effective.

Fine temperature control of the trapping means 64 will now be described in detail.

FIG. 7 schematically shows an example of the apparatus centered on a temperature control mechanism for conducting fine temperature control. In FIG. 7, the structure of the vacuum chamber 10 is not shown, and constituent elements having been described before in FIG. 1 will not be described again unless particularly referred to. This example again refers to sputtering equipment. In this instance, the cooling means 62 utilizes a heat exchanger.

The temperature of the cooling panel as trapping means 64 is set to 100K or below. The temperature control mechanism affects fine temperature control in such low temperature range. To this end, the fore vacuum pumping mechanism is provided with temperature control means 100 for controlling the cooling temperature of the trapping means 64. The temperature control means 100 includes at least a compressor 102 for circulating suitable cooling medium to the cooling means 62, the in- and out-flow duct lines 104 and 106 provided between the cooling means 62 and compressor 102, the bypass duct line 108 provided between the above two duct lines and the cooling medium flow control means 110 provided on an intermediate portion of the bypass duct line 108.

The temperature control means 100 may be provided, if necessary, with a temperature detection means 112 for detecting the temperature of the trapping means 64 and a temperature monitoring means 114 for controlling the control amount of the flow rate control means 110 according to the detected temperature.

In this case, a single stage Giford Macphon heart exchanger is used as the heat exchanger 62. As the cooling medium, gaseous helium is used. The heat exchanger 62 is connected via the in- and out-flow duct lines 104 and 106 to a compressor 102 as the conveying means. Gaseous helium as the cooling medium is led from the compressor 102 through the out-flow duct line 106 to the heat exchanger 62 and thence through the out-flow duct line 104 back to the compressor 102. The gaseous helium is subjected to compression and expansion in the heat exchanger to cool the cooling panel 64.

The flow control means 110 provided on the bypass duct line 108 is suitably an on-off control valve. It may be a manual valve or an automatic control valve. The rate Q of flow of gaseous helium is controlled through on-off control of the control valve 110.

Temperature changes of the cooling panel 64 by controlling the flow rate of the cooling medium were measured.

Results of measurements are shown in FIG. 8. In FIG. 8, the ordinate is for the cooling temperature of the cooling panel 64, and the abscissa is for the opening degree of the valve (the opening degree being 0% when the valve is fully closed and 100% when the valve is fully open).

As will be seen from the measurement results, the cooling temperature is 30K when the control valve 110 is fully closed and is 60K when the valve is fully open. It will also be seen that the opening degree of the control valve 110 and cooling temperature are substantially proportional to each other. It will further be understood that the temperature control of the cooling temperature of the cooling panel 64 as the trapping means is possible with fine controlling the control valve 110. Furthermore, in this embodiment, the fine control can be made as low a temperature range as 30 to 60K.

The control valve 110, as the flow control means noted above, may be controlled in response to the temperature of the cooling panel 64 as the trapping means. A structure for such a case will be described. As the temperature detection means 112 a thermocouple is used. The temperature monitoring means 114 is constituted with, for example, a PID, PI or relay on-off control type. In this case, a heat exchanger is also used as the cooling means 62. The the in- and out-flow duct lines 104 and 106 constituting temperature control means 100 noted above are connected to the heat exchanger 62 such that gaseous helium from the compressor 102 flows back through the heat exchanger 62. On the other hand, thermocouple 112 is held in contact with the cooling panel 64 as the trapping means, and the temperature of the cooling panel is in the form of an electric signal measured by the temperature monitoring means 114. The temperature of a reference temperature is preliminarily set in the temperature monitoring means 114. In accordance with the result of comparison, the opening degree of the control valve 110 may be controlled to control the cooling temperature of the cooling panel 64 to the preset reference temperature.

To this end, as described earlier in connection with FIG. 1, the sputtering chamber 10 is first exhausted to the vicinity of a vacuum degree of $1 \times 10^{-7}$ Torr with the roughing vacuum pump 30 and cryogenic pump 32 in the main vacuum mechanism 50. Subsequently, argon gas is introduced at a rate of 80 SCCM into the chamber 10 to set the pressure therein to $2 \times 10^{-3}$ Torr. Then the temperature of the cooling panel 64 is set to the reference temperature of 40K.

After completion of these settings, a sputtering processing is executed by plasma discharging of the argon gas. During observation of the status of plasma discharge during this processing, it is observed that the discharge never vanished due to argon gas pressure changes. Further, gas present in the sputtering chamber 10 during the discharge was observed using a quadruple analyzer (AQA series by ANELVA Corp.). The results are shown in FIG. 9(A).

In FIG. 9(A), the ordinate is for the current (in amperes), and the abscissa is for the observation time (in minutes). The current value is proportional to the partial pressure of the gas observed n the chamber 10. An analysis engineer will readily understand that the detected current value is readily of the partial pressure.

According to the experiment, there is mainly observed data concerning argon (Ar) gas and water ($H_2O$). Further, other observed gases are, for example, carbon monoxide (CO) and nitrogen ($N_2$).

To confirm the effect of the cooling panel 64, vacuum pumping and sputtering were carried out in the same method and under the same conditions as in the case of which the cooling temperature was set to 40K, except that the cooling panel 64 is now held at normal temperature (for instance at a temperature of 300K or above) without cooling it at all. The result was observed as discussed above with the quadruple pole mass analyzer. The results of observation are shown in FIG. 9(B). In FIG. 9(B), the ordinate is for the current (in amperes), and the abscissa is for the observation time (in minutes). Again in this case, argon gas and water vapor were main gases observed, and other observed gases are mixtured gas of carbon monoxide (CO) and nitrogen ($N_2$).

By comparing the observation results in the case of cooling the cooling panel 64 to 40K (FIG. 9(A) and the case of holding the panel at normal temperature without any cooling (FIG. 9(B), the following facts will be readily understood.

a) It is seen that in the case of setting the temperature of the cooling panel to 40K the partial pressure of water vapor is extremely low. The current value indication of the concentration of water vapor detected during the discharge, in the case of FIG. 9(A), is about $1 \times 10^{-11}$ A (A being ampere), while in the case of FIG. 9(B), it is about $8 \times 10^{-11}$ A. The latter value is about 8 times that of the former. This means that by cooling the cooling panel 64 to 40K, the partial pressure of water vapor can be reduced to about one-eighth in pressure in comparison with the case of no cooling. Further, the partial pressure of water vapor is proportional to the number of steam molecules, and hence, the above fact indicates that the water molecules having been in the chamber 10 are extremely reduced.

Usually, the plasma discharge brings about a phenomenon of emission of water molecules which have been remaining on the irregular microscopical uneven inner wall surfaces of the chamber 10. In spite of such emission of water molecules, however, the partial pressure of water is extremely reduced as can be understood from the above experimental results. This means that the cooling of the cooling panel permits sufficient exhausting of water molecules in the chamber 10 even during the sputtering.

b) Meanwhile, it is seen that in the case of argon gas since the detected current value is substantially the same in the sputtering processing in the experiments, the flow rate of argon gas was held constant at 80 SCCM in either case. Nevertheless, the current value indicative of argon gas, i.e., the partial pressure thereof, is constant. This indicates that argon atoms are not trapped onto the cooling panel 64 even by cooling the same. In addition, during the processing in the experiments, stable discharge of argon gas was observed. This indicates that the argon gas pressure is quite stable.

The phenomenon as shown by FIG. 9(A) and 9(B) can be readily understood by using various vapor pressure curves.

FIG. 10 shows vapor pressures of various gases, which are described, for example, in a literature entitled "Physics and Application of Vacuum" Physics Selection No. 11, issued by Shokabo on Oct. 22, 1980, p. 292. In FIG. 10, the ordinate is for the vapor pressure (in Torr) of each gas, and the abscissa is for the temperature (in OK).

To confirm the above facts of (a) and (b), we first took an argon gas pressure of $2\times 10^{-3}$ Torr. It is seen from the argon gas vapor pressure curve that the argon gas vapor pressure of $2\times 10^{-3}$ Torr corresponds to a saturated vapor pressure temperature of 40K. If the temperature of the corresponding to saturated vapor pressure of the argon gas is about 40K, the saturated vapor pressure of the argon gas is about $2\times 10^{-3}$ Torr, as is seen from the saturated vapor pressure of the argon gas curve shown in FIG. 10. This means that there are variations of the set pressure of argon gas. Particularly, it is seen that the saturated vapor pressure of the argon gas is reduced to be below the set pressure when the temperature is below 40K. Thus, it will be seen that the setting of the temperature of the cooling panel 64 to 40K and the setting of the argon gas pressure to $2\times 10^{-3}$ Torr are optimum settings. If the set temperature of the cooling panel 64 is below 40K, the saturated vapor pressure is below $2\times 10^{-3}$ Torr. Thus, argon atoms present as atmospheric gas are absorbed and reduce the argon gas pressure. The absorption of argon atoms exiting as atmospheric gas onto the cooling panel 64 can be readily understood from the following experiment.

Sputtering was carried out by setting the argon gas pressure to $2\times 10^{-3}$ Torr and setting the temperature of the cooling panel 64 to 40K, the corresponding saturated vapor pressure temperature, and also to a lower temperature of 30K. After the sputtering, the cooling of the cooling panel 64 was discontinued, and the gas emitted from the cooling panel 64 was measured with a quadrupole mass analyzer. The results are shown in FIG. 11(A) and 11(B).

In these graphs, the ordinate is for the partial pressure (in any unit), and the abscissa is for the time (in any unit) passed after the discontinuation of the cooling. Solid curves I and II are obtained with argon gas (Ar), and broken curves III and IV are obtained with water ($H_2O$).

It will be understood from the above experimental results that argon atoms are absorbed to the cooling panel 64 at 30K, which is lower than the saturated vapor pressure temperature. This means that it is seen from the experimental results that by setting the temperature of the cooling panel 64 to be above the saturated vapor pressure, the temperature corresponding to the preset argon atom pressure, argon atoms will not be attached to the cooling panel 64, and the preset pressure can be maintained to be constant. This supports the phenomenon noted above in (b).

Sputtering was carried out by setting the argon gas pressure to $2\times 10^{-2}$ Torr and setting the temperature of the cooling panel 64 to 40K, the corresponding saturated vapor pressure temperature, and a lower temperature of 30K. After sputtering, the cooling of the cooling panel 64 was discontinued, and the gas emitted from the cooling panel 64 was measured with a quadrupole mass analyzer. The results are shown in FIG. 11(A) and 11(B).

In these graphs, the ordinate is for the partial pressure (in any unit), and the abscissa is for the time (in any unit) passed after the discontinuation of the cooling. Solid curves I and II are obtained with argon gas (at), and broken curves III and IV are obtained with water ($H_2O$).

It will be understood from the above experimental results that argon atoms are absorbed to the cooling panel 64 at 30K, a temperature lower than the saturated vapor pressure temperature. This means that it is seen from the experimental results that by setting the temperature of the cooling panel 64 to be above the saturated vapor pressure, the temperature corresponding to the preset pressure of argon atoms, no argon atoms will be absorbed to the cooling panel 64, and the preset pressure can be maintained to be constant. This supports the phenomenon mentioned above in (b).

In the meantime, for exhausting water vapor with the cooling panel 64, the temperature of the cooling panel 64 is desirably set to be as low as possible. However, to maintain a constant argon gas pressure, the cooling panel temperature can not be set to be lower than the saturated vapor pressure temperature corresponding to the preset pressure of argon gas. If the preset pressure of argon gas is $2\times 10^{-3}$ Torr, the temperature of the cooling panel 64 is desirably set to 40K. In this case, although no vapor pressure curve of water vapor corresponding to 40K is shown in FIG. 10, it is expected from the extrapolation of the saturated vapor pressure curve that the vapor pressure of steam is extremely reduced. From this, it is expected to obtain the most efficient absorption of water molecules to the cooling panel 64, permitting the same to exhaust water vapor efficiently. Further, it is seen from the experimental results of FIG. 11(B) that water molecules are actually absorbed to the cooling panel 64. This supports the phenomenon mentioned before in (a).

While it has been shown above that water molecules can be sufficiently exhausted, it is also expected that carbon dioxide molecules can be sufficiently exhausted, as understood similarly from the vapor pressure curve shown in FIG. 10. Further, efficient exhausting of water molecules can be obtained by performing roughing out of the chamber 10 with the roughing vacuum pump 30 and cryogenic pump 32 in the mechanism 50, then performing continual vacuum pumping to the vicinity of $1\times 10^{-9}$ Torr by starting the mechanism 50 and then affecting the setting of the temperature of the cooling panel 64 by operating the temperature control means 100.

From the above description, the following conclusion can be obtained. For obtaining the most efficient pumping of water molecules as impurity while maintaining a constant plasma discharge gas pressure, the cooling panel temperature may be set to the saturated vapor pressure temperature corresponding to the preset pressure of the plasma discharge gas. It is apparent, when the discharge gas is, for example, argon gas and its pressure is set to, for example, $1\times 10^{-2}$ Torr, the most efficient exhausting of water molecules can be obtained by setting the cooling panel temperature to 45K.

Consequently, the present invention is applicable to the following cases.

(i) Where the plasma discharge gas is oxygen gas and the pressure thereof is set to $1\times 10^{-3}$ Torr, the most efficient exhausting of water molecules can be obtained by setting the cooling panel temperature to 40K.

(ii) Where the plasma discharge gas is nitrogen gas and the pressure thereof is set to $1\times 10^{-3}$ Torr, the most efficient exhausting of water molecules can be obtained by setting the cooling panel temperature to about 38K.

(iii) In the above cases of (i) and (ii), not only water molecules but also carbon dioxide molecules can be efficiently exhausted as impurity.

(iv) Using argon gas as the plasma discharge gas in dry etching process, water molecules and carbon dioxide molecules can be efficiently exhausted while maintaining a constant gas pressure.

(v) The present invention is applicable as well to refine gas when the saturated vapor pressure is higher than that of impurity gas. For example, water vapor or carbon dioxide gas contained as impurity gas in argon gas as the main component gas can be efficiently exhausted.

However, further experiments were conducted, in which sputtering was carried out to form an aluminum film by setting the argon gas pressure to $2 \times 10^{-3}$ Torr and setting the cooling panel temperature to a suitable range, i.e., about 40K to about 70K. It is well known in the art the characteristics of aluminum thin film (particularly the life span of aluminum film wiring in a semiconductor which closely depends on electromigration) is greatly affected by the residual gases, such as water vapor, in the sputtering chamber. In the above experiments, however, no deterioration of the thin film characteristics of the aluminum thin film by water vapor was observed. Consequently, it was found that sufficient exhausting to eliminate the adverse effects of water vapor on the aluminum film characteristics could be obtained even with the setting of the temperature of the cooling panel 64 in this range.

While the trapping means 64 as the cooling panel has been described in connection with an example of exhausting, performance can be obtained by simultaneously exhausting unnecessary residual gas. However, as described before, with exhausting of argon (At) gas which is usually used as the process gas, the sputtering efficiency is reduced. It is better to avoid exhausting of argon (Ar) gas so as to avoid adverse effects on the control of the rate of introduction of the process gas. The trapping temperature of argon is about 20K, and the trapping means 64 is suitably cooled, if necessary, to a temperature corresponding to a design for a higher temperature than 20K, preferably 40 to 70K.

Effects of the Invention

As has been described in the foregoing, with the sputtering equipment according to the present invention, the fore vacuum pumping mechanism is provided in addition to the main vacuum mechanism, and the trapping means is cooled down to a cryogenic temperature to exhaust the unnecessary residual gas component. Thus, the following effects can be obtained.

(1) The attainable ultimate pressure can be improved by one figure or more, and thus it is possible to obtain ultra high vacuum of the order of $10^{-9}$ Torr. As a result, it is possible to improve the film quality (particularly with Al wiring improving the life span of aluminum thin film in semiconductor).

(2) The exhausting time can be reduced to 4 to 5 hours, particularly compared to the prior art, with a vacuum degree of the order of $3 \times 10^{-8}$ Torr. Further, it is possible to attain $10^{-9}$ Torr in about 10 hours. It is thus possible to improve the productivity (or throughput) with reduction of the exhausting time.

What is claimed is:

1. A vacuum processing equipment comprising a vacuum chamber and main and fore vacuum pumping mechanisms for pumping down said vacuum chamber; said fore vacuum pumping mechanism including:

(a) trapping means disposed in said vacuum chamber for trapping residual gas;

(b) a heat exchanger disposed outside said vacuum chamber and coupled to said trapping means for cooling the trapping means; and (c) a temperature control means for controlling the cooling temperature of the trapping means, including a compressor for circulating a cooling medium in said heat exchanger, an in-flow duct for introducing said cooling medium into said heat exchanger, an out-flow duct for introducing said cooling medium from the heat exchanger into a conveying means, a bypass duct provided between said in-flow and out-flow ducts and a flow rate control means provided on said bypass duct for directly controlling the flow of said cooling medium.

2. The vacuum processing equipment according to claim 1, wherein said cooling medium is a gaseous helium.

3. The vacuum processing equipment according to claim 1, wherein said flow rate control means includes an on- and off- valve.

4. The vacuum processing equipment according to claim 1, wherein said temperature control means further includes:

a temperature detection means for detecting the temperature of said trapping means and temperature monitoring means for controlling said flow rate control means while checking the temperature detected by said temperature detection means with respect to a preset reference temperature to maintain a constant temperature of said trapping means.

5. The vacuum processing equipment according to claim 4, wherein said temperature detection means is thermocouple.

6. The vacuum processing equipment according to claim 4, wherein said temperature control means is either a PID control system or a PI control system or a relay on-off system.

7. The vacuum processing equipment according to claim 1, wherein said trapping means is disposed along an inner wall of the vacuum chamber.

8. The vacuum processing equipment according to claim 1, wherein said trapping means has at least a panel portion.

9. The vacuum processing equipment according to claim 1, wherein the trapping means has a panel portion and a fin portion united to the panel portion.

10. The vacuum processing equipment according to claim 1, which further comprises heating means for heating said trapping means.

11. The vacuum processing equipment according to claim 8, wherein said heating means is disposed outside the chamber and at a coupling section between said heat exchanger and trapping means.

12. The vacuum processing equipment according to claim 1, wherein said trapping means is constituted by a heat conductor.

13. The vacuum processing equipment according to claim 1, which is a sputtering equipment.

14. The vacuum processing equipment according to claim 1, which is a dry etching equipment.

* * * * *